(12) United States Patent
Duggan et al.

(10) Patent No.: US 7,193,307 B2
(45) Date of Patent: Mar. 20, 2007

(54) MULTI-LAYER FET ARRAY AND METHOD OF FABRICATING

(75) Inventors: Michael R. Duggan, Quincy, MA (US); Nazario Lopes, South Easton, MA (US)

(73) Assignee: Ault Incorporated, Minneapolis, MN (US)

( * ) Notice: Subject to any disclaimer, the term of this patent is extended or adjusted under 35 U.S.C. 154(b) by 0 days.

(21) Appl. No.: 10/863,153

(22) Filed: Jun. 7, 2004

(65) Prior Publication Data

US 2005/0212122 A1 Sep. 29, 2005

(51) Int. Cl.
*H01L 23/02* (2006.01)

(52) U.S. Cl. .................. 257/686; 257/712; 257/713; 257/E25.013; 257/E25.017; 257/E23.085

(58) Field of Classification Search ................ 257/686
See application file for complete search history.

(56) References Cited

U.S. PATENT DOCUMENTS

| | | | |
|---|---|---|---|
| 4,495,546 A | 1/1985 | Nakamura et al. | |
| 4,567,543 A | 1/1986 | Miniet | |
| 4,574,879 A | 3/1986 | DeGree et al. | |
| 4,602,125 A | 7/1986 | West et al. | |
| 4,602,678 A | 7/1986 | Fick | |
| 4,666,545 A | 5/1987 | DeGree et al. | |
| 4,685,987 A | 8/1987 | Fick | |
| 4,755,249 A | 7/1988 | DeGree et al. | |
| 4,792,879 A | 12/1988 | Bauknecht et al. | |
| 4,810,563 A | 3/1989 | DeGree et al. | |
| 4,842,911 A | 6/1989 | Fick | |
| 4,853,763 A | 8/1989 | Degree et al. | |
| 4,959,630 A | 9/1990 | Yerman et al. | |
| 5,170,326 A | 12/1992 | Meny et al. | |
| 5,276,421 A | 1/1994 | Boitard | |
| 5,448,511 A | 9/1995 | Paurus et al. | |

(Continued)

FOREIGN PATENT DOCUMENTS

GB 191329274 2/1915

OTHER PUBLICATIONS

Derman, Glenda, "Density forces a bend in contacts" pp. 1-10, Electronic Engineering Times, Dec. 1997, Issue 984, p. 105.

(Continued)

*Primary Examiner*—Evan Pert
*Assistant Examiner*—Benjamin P. Sandvik
(74) *Attorney, Agent, or Firm*—SoCal IP Law Group LLP; Mark A. Goldstein; John E. Gunther

(57) ABSTRACT

A power array includes a plurality of FET power assemblies and each FET power assembly has at least one field effect transistor mounted to a ciruit board. The circuit boards are arranged atop each other. A power supply pin extends through the circuit boards and is connected to a power input of each field effect transistor. A power output of each FET power assembly is connected to a power output pin which extends through each of the circuit boards. A heat sink is mounted to the power array beneath the lowest FET power assembly and is thermally connected to the field effect transistors of each FET power assembly. A method of assembling a power array including a plurality of FET power assemblies with at least one field effect transistor.

8 Claims, 3 Drawing Sheets

U.S. PATENT DOCUMENTS

| | | | |
|---|---|---|---|
| 5,463,530 A | 10/1995 | DeGree | |
| 5,519,358 A * | 5/1996 | Tserng | 330/307 |
| 5,650,593 A | 7/1997 | McMillan et al. | |
| 5,679,457 A | 10/1997 | Bergerson | |
| 5,754,409 A | 5/1998 | Smith | |
| 5,777,844 A | 7/1998 | Kiefer | |
| 5,910,010 A * | 6/1999 | Nishizawa et al. | 438/15 |
| 5,933,343 A * | 8/1999 | Lu et al. | 363/144 |
| 5,950,066 A | 9/1999 | Hanson et al. | |
| 5,969,945 A | 10/1999 | Cutting et al. | |
| 5,986,887 A | 11/1999 | Smith et al. | |
| 6,075,701 A | 6/2000 | Ali et al. | |
| 6,129,260 A | 10/2000 | Andrus et al. | |
| 6,165,612 A | 12/2000 | Misra | |
| 6,197,859 B1 | 3/2001 | Green et al. | |
| 6,208,031 B1 | 3/2001 | Fraivillig | |
| 6,222,437 B1 | 4/2001 | Soto et al. | |
| 6,275,111 B1 * | 8/2001 | Seely et al. | 330/286 |
| 6,339,120 B1 | 1/2002 | Misra et al. | |
| 6,359,515 B1 | 3/2002 | Buer | |
| 6,362,689 B1 | 3/2002 | Buer | |
| 6,388,528 B1 | 5/2002 | Buer et al. | |
| 6,399,209 B1 | 6/2002 | Misra et al. | |
| 6,462,412 B2 | 10/2002 | Kamei et al. | |
| 6,490,162 B2 | 12/2002 | Siu | |
| 6,519,156 B2 | 2/2003 | Scafidi | |
| 6,578,260 B1 * | 6/2003 | Dixon et al. | 29/830 |
| 6,691,239 B1 * | 2/2004 | Rose | 713/330 |
| 6,831,835 B2 * | 12/2004 | Soto | 361/704 |
| 2001/0008306 A1 | 7/2001 | Kamei et al. | |
| 2002/0030973 A1 | 3/2002 | Scafidi | |
| 2002/0080586 A1 | 6/2002 | Siu | |

OTHER PUBLICATIONS

Chichilli, Deepak, et al. "Investigation of the bond strength of polyimide adhesive" Technical Division/Engineering and Fabrication Dept. Jan. 1998, pp. 1-7.

The Berquist Company, "Thermal Clad Selection Guide" Jan. 2002, pp. 1-29.

de Sorgo, Miksa, "A thermal comparison of power device mounting technlogies" Power Site, Automated Power Semiconductor Attachment, Chromerics Div., Parker Hannifan Corporation, Dec. 2000, pp. 1-7.

* cited by examiner

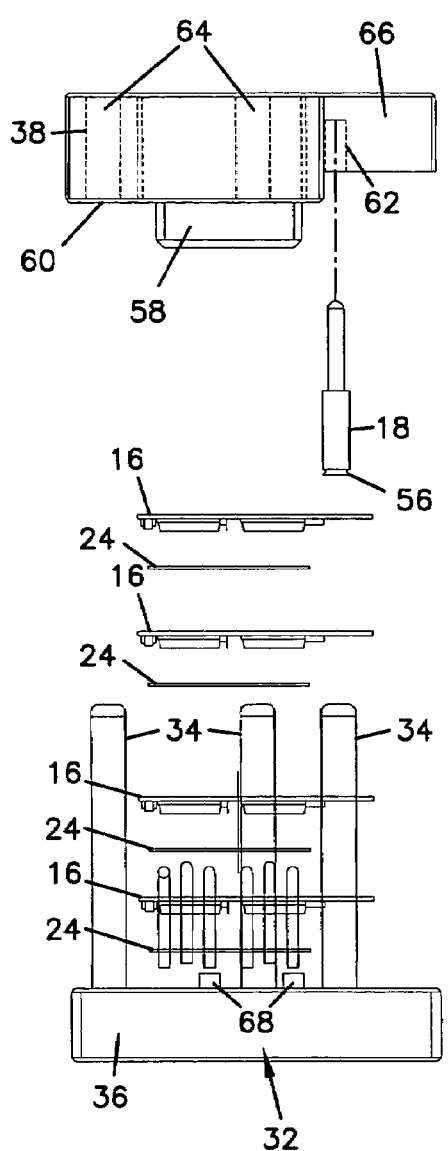
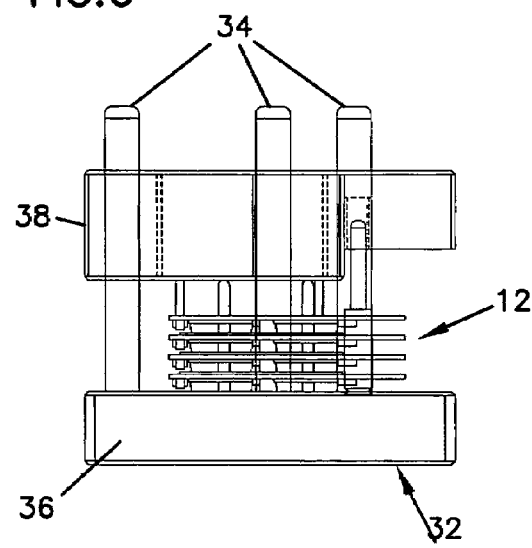
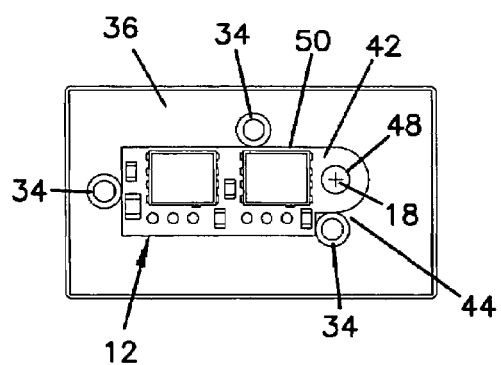

MULTI-LAYER FET ARRAY AND METHOD OF FABRICATING

TECHNICAL FIELD

This invention relates generally to FET arrays for providing power to electronic devices, and more particularly, to multi-layer FET arrays, to methods for fabricating such arrays, and to power supplies including such arrays.

BACKGROUND

Many systems employ electrical devices. It is often desirable to densely pack these devices so as to reduce the size of the system. Indeed, the ability to do so can be essential to meeting the demand for systems having smaller packages and ever increasing power densities.

In these densely packed systems, power must be provided to operate the electrical devices. It is also desirable that the power supplies be arranged and configured to take up as little space as possible. Often, such power supplies might include a Field Effect Transistor (FET). To provide power to a plurality of electrical devices within the system, often these power supplies would include multiple FETs in order to supply the power required by the other electrical components. Such FETs may be mounted to printed circuit boards (PCBs) alongside the other components. Alternatively, FETs may be mounted to smaller component PCBs and the component PCBs mounted to the main PCB with the other components.

However, the space required for each of the FETs reduces the amount of space within the system for the inclusion of other electrical components, assuming that a given system volume is fixed and the system has a finite amount of PCB area for mounted electrical components within a given space. If the system requires a certain type and array of components, then the system would be configured to fit into a larger volume.

It is desirable to improve the density of power supply that may be provided within an electrical system without requiring additional PCB area.

SUMMARY

The present invention relates to a power away including a plurality of FET power assemblies, each FET power assembly with at least one field effect transistor mounted to a circuit board. The circuit boards are arranged atop each other. A power supply pin extends through the circuit boards and is connected to a power input of each field effect transistor. A power output of each FET power assembly is connected to a power output pin which extends through each of the circuit boards. A heat sink is mounted to the power away beneath the lowest FET power assembly and is thermally connected to the field effect transistors of each FET power assembly.

The present invention further relates to a method of assembling a power array including a plurality of FET power assemblies. The FET power assemblies are positioned within a plurality of pins of a base of a power array assembly fixture. Power input pins are inserted through first opening in the FET power assemblies and a power output pin is inserted within a second opening in each of the FET power assemblies. The FET power assemblies and the pins are bonded together into a power array which is removed from the power array assembly fixture. The power array is mounted to a heat sink and each FET assembly is thermally connected to the heatsink.

Other advantages of the multi-layer laminate and method of the present invention will become apparent in view of the following detailed description of preferred embodiments, claims, and accompanying drawings.

BRIEF DESCRIPTION OF THE DRAWINGS

The accompanying drawings, which are incorporated in and constitute a part of the description, illustrate several aspects of the invention and together with the detailed description, serve to explain the principles of the invention. A brief description of the drawings is as follows:

FIG. 5 is a side exploded view of a fixture for assembling the FET power array of FIG. 2.

FIG. 6 is a side view of the fixture of FIG. 5, with the components of the FET power array positioned within the fixture.

FIG. 7 is a top view of the fixture of FIG. 5, with the top of the fixture removed.

DETAILED DESCRIPTION

Reference will now be made in detail to exemplary aspects of the present invention which are illustrated in the accompanying drawings. Wherever possible, the same reference numbers will be used throughout the drawings to refer to the same or like parts.

Figure 1:
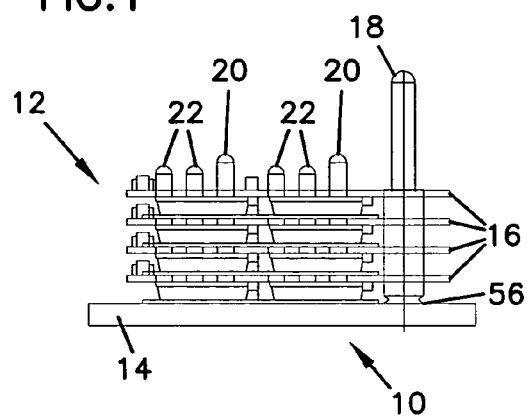
FIG. 1 is a side view of an FET power array mounted to a heat sink.

FIG. 1 shows a power assembly 10 for providing power to other electrical devices. Power assembly 10 includes a FET array 12 mounted to a heat sink 14. FET assembly 12 includes a plurality of FET assemblies 16, a power output pin 18, a pair of switch or gate control pins 20 and a plurality of power input pins 22. Power or current input pins 22 and power output pin 18 may also serve other functions, such as structurally supporting array 12, in addition to conveying electrical current from and to FETs 26. Gate control pins 20 may also provide structural support to array 12.

Arranging FET assemblies 16 in the manner shown in FIG. 1 permits each FET assembly 16 to be connected in parallel with other FET assemblies 16, as opposed to being connected in series. Each FET 26 on a FET assembly 16 presents a certain amount of resistance to current flow from power input pins 22 to power output pin 18. Multiple FETs 26 connected in parallel, as shown in FIG. 1, will result in less total resistance than the same number of FETs 26 connected in series. Thus, FET array 12 of power assembly 10 with FETs 26 connected in parallel is able to provide power to downstream devices at a higher current than a device with a similar number of FETs arranged in series.

Figure 2:
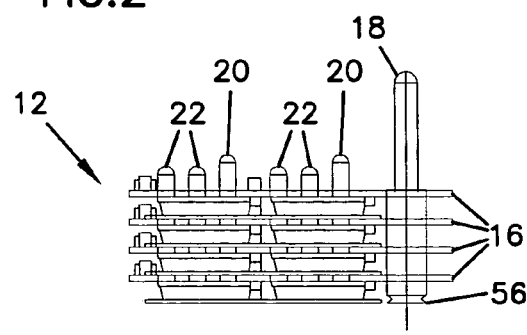
FIG. 2 is a side view of the FET power array of FIG. 1, removed from the heat sink.
Figure 3:
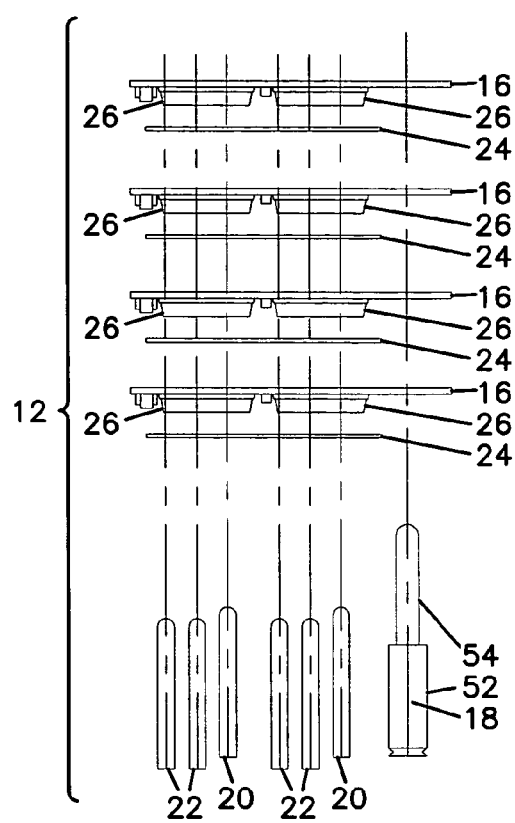
FIG. 3 is a side exploded view of the FET power array of FIG. 2.

As shown in FIGS. 2 and 3, array 12 includes four FET assemblies 16, stacked one on top of each other, with pins 18, 20 and 22 extending generally perpendicular to assemblies 16. Between each pair of FET assemblies 16 are electrically insulative pads 24 which provide electrical insulation and prevent physical contact of FETs 26 with adjacent FET assemblies 16. Another pad 24 is positioned beneath the lowest FET assembly 16 to provide electrical insulation between the lowest FET assembly and heat sink 14.

Figure 4:
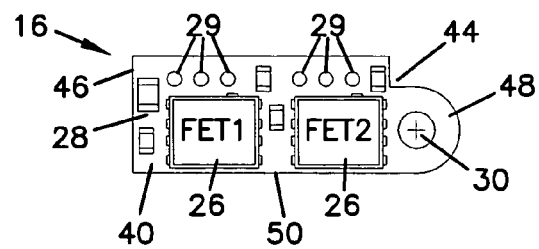
FIG. 4 is a bottom view of one of the FET assemblies of the FET power array of FIG. 2.

Referring now to FIG. 4, FET assembly 16 includes a pair of FET banks 26 mounted to a circuit board 28. Circuit board 28 includes traces which provide electrical connectivity between pins 18, 20 and 22, the FET banks 26, and other electrical components of FET assembly 16. Circuit board 28 includes a plurality of pin openings 29 for pins 20 and 22 and a pin opening 30 for power output pin 18.

As shown in the FIGS., pin 18 includes a larger diameter lower section 52 which engages opening 30 of each FET assembly 16 and a smaller diameter upper section 54. Alternatively, pin 18 may be a consistent diameter over its entire length and sized to fit within opening 30. Pin 18 extends above the top-most FET assembly 16 to provide a stand-off to prevent FET array 12 or power assembly 10 from being mounted too closely to other objects within an enclosure. This will help prevent interference with the function of power assembly 10 and aid in cooling airflow about FET assemblies 16. Pin 18 may be sized to extent no further above the top-most FET assembly than is necessary to aid assembly of FET array 12 and connection of pin 18 to items requiring power from FET array 12. Current input pins 22 as shown only extend far enough above top-most FET assembly 16 to provide convenient connection to current sources, such as a power circuit, that are needed to supply FET banks 26 to create suitable power to be output by pin 18. Heat sink 14 may also include a printed circuit board which includes the power circuit, allowing pins 22 to receive current from below the bottom-most FET assembly 16. Gate control pins 20 only extend far enough above top-most FET assembly 16 to aid in connection with a control circuit mounted elsewhere in the electronic device to which FET assembly 10 is supplying power. Pins 20 may also extend further above the top-most FET assembly 16. Alternatively, heat sink 14 may include a printed circuit board which includes the control circuit, allowing gate control pins 20 to receive gate switching instructions from below the bottom-most FET array 16.

Pins 20 and 22 are shown the same length. Pins 22 are seated against heat sink 14 in power assembly 10 to provide a heat path from the heat generating FET banks 26 to heat sink 14. Pins 20 are mounted offset from heat sink 14 so that there is no electrical connectivity between pins 20 and heat sink 14. As noted above, if heat sink 14 includes a printed circuit board with a power input circuit or a gate control circuit, pins 22 and 20, respectively, may be electrically connected with heat sink 14. Similarly, pin 18 may be mounted similarly vertically offset from heat sink 14. A spacer or electrically insulative pad 56 may also be mounted between pin 18 and heat sink 14 to ensure that no output power is directed into heat sink 14 rather being directed to another electrical element requiring power to operate. By offsetting the power and current handling pins 18 and 20 from heat sink 14, heat sink 14 may be made from a metallic material, such as aluminum or other common heat sink materials, without concern regarding the dielectric properties of the material.

As shown, pins 20 are not involved in the transfer of power or electrical current to or from FET banks 26. Rather, pins 22 are used primarily to control transfer heat generated by FET banks 26 to heat sink 14. Additional heat transfer to heat sink 14 may come through insulative pads 24 and 56, although pads 24 and 56 may provide some degree of thermal as well as electrical insulation. Alternatively, pins 18, 20 and 22 may be electrically connected to an electrical circuit member positioned atop heat sink 14 but electrically insulated from heat sink 14. Such a circuit member may be thermally bonded to heat sink 14 and permit pins 18 and 20 to be used as additional conduits to permit heat flow from FET assemblies 16 to heat sink 14. In such an alternative arrangement, current input pins 22 may be thermally isolated from heat sink 14, if the additional thermal transfer capacity is not required.

As shown in FIG. 4, FET assembly 16 has FET banks 26 mounted to a bottom surface 40 of circuit board 28. Alternatively, FET banks 26 could be mounted to a top surface 42 (shown in FIG. 7).

Figure 8:
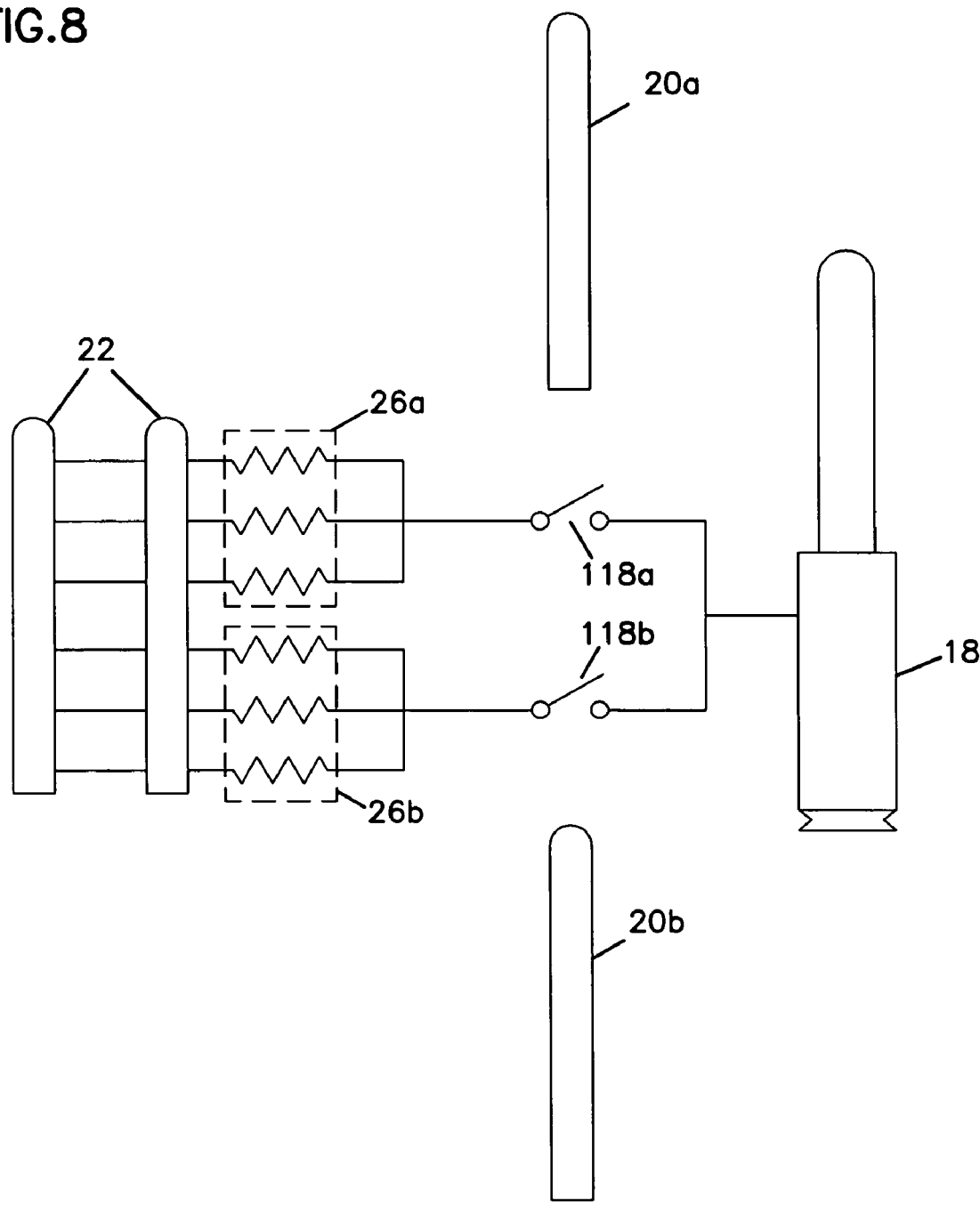
FIG. 8 is a schematic diagram of an FET power array according to the present invention.

FIG. 8 is a schematic diagram of an FET assembly 116, which may be used with FET array 12 and power assembly 10. FET assembly 116 may be similar in layout and function to FET assembly 16, described above. FET assembly 116 includes a pair of FET banks 26, labeled A and B, a pair of gate control pins 20, labeled A and B, a pair of switches 118, labeled A and B, a plurality of current input pins 22, and a power output pin 18. Switches 118 are mounted to circuit board 28. Pins 22 are electrically connected to a current source. Pin 18 is electrically connected to a device or circuit requiring power. Pins 22 are electrically connected to each of the FET banks 26 A and B. Switches 118 A and B are connected to the corresponding gate control pin 20 A and B, respectively. Flow of power from either of FET banks 26 A and B is determined by the state of switches 118 A and B. The state of switches 118 A and B is controlled by commands set through gate control pins 20 A and B, respectively, by the control circuit. Switches 118 A and B may operate in a complimentary fashion, so that pin 18 receives power from one of the FET banks 26 but is prevented from being left without power or from receiving power from both FET banks simultaneously.

To control power flow to pin 18, the control circuit provides commands through pins 20 to switches 118 to move to a high state (closed) or to a low state (open). When switch 118A is moved to high, switch 118B is moved to low, and current flows from pins 22 into FET bank 26A and to pin 18. When switch 118A is moved to low, switch 118B is moved to high and current flows from pins 22 into FET bank 26B and to pin 18.

Referring now to FIGS. 5 to 7, a method of assembling FET array 12 is illustrated. An assembly jig or fixture 32 includes a plurality of posts 34 for orienting and positioning FET assemblies 16 one atop the other. As shown in FIG. 8, posts 34 are arranged to cooperate with features of circuit board 28, such as a recess 44 (shown in FIG. 4) and an end 46 (shown in FIG. 4) opposite from a tab 48 where opening 30 is located. A further post 34 engages a side 50 (shown in FIG. 4). Posts 34 cooperate with recess 44, end 46 and side 50 to align FETs assemblies 16 so that openings 29 and 30 of the assemblies are coaxially aligned. This alignment allows pins 18, 20 and 22 to be positioned within these openings.

To assemble FET array 12, a first pad 24 is placed on a base 36 of assembly fixture 32. A first FET assembly 16 is placed between posts 34 atop of the pad 24 on fixture base 36. A second pad 24 is placed on the first FET assembly 16 and a second FET assembly 16 is placed on the second pad 24. This process continues until the desired number of FET assemblies 16 have been positioned between posts 34 atop base 36. Pins 20 and 22 may be inserted after all FET assemblies 16 have been positioned on base 36 or may be inserted earlier in the assembly process. Pin 18 may also be inserted after all FET assemblies 16 have been positioned or earlier in the assembly process. Pad 56 is positioned between pin 18 and base 34.

Once all FET assemblies 16 and pins 18, 20 and 22 have been positioned atop base 36, a top 38 of assembly fixture 32 is placed on posts 34. Top 38 includes a lower extension 58 which extends from a lower surface 60 of top 38 the distance that pins 20 are desired to extend above the top-most FET assembly 16. Top 38 also includes an opening 62 into which upper portion 54 of pin 18 may extend. Top further includes a plurality of openings 64 into which posts 34 may extend. As shown, top 38 includes two openings 64 for receiving two of the three posts 34 and a recess 66 permitting the third post 34 to pass alongside top 38. Base 34 includes a pair of raised seats 68 which are positioned beneath openings 29 for receiving pins 20. Seats 68 provide the desired offset of pins 20 above heat sink 14 when FET array 12 is included within power assembly 10.

Extension 58, opening 62 and openings 64 cooperate to permit top 38 to positioned on base 36 of fixture 32 with extension 58 atop the top-most FET assembly 16. Extension 58 compresses the FET assemblies 16 and pads 24 together, and lower surface 60 engages pins 20 and compresses pins 20 against seats 68. While these components are so held within fixture 32, they may be soldered together to form FET array 12. Solder applied to pins 18 and 20 will aid the electrical connection of the pins with FET banks 26 and traces of circuit board 28 while solder applied to pins 22 will aid the mechanical and thermal connection of pins 22 to circuit board 28. Alternatively, pins 22 may be sized to be require only a press or friction fit, and not require solder. As a further alternative, other mechanical or chemical bonding agents may be used to connect pins 22 within FET array 12.

Once FET assemblies 16 have been positioned with respect to pins 18, 20 and 22, and fixed in place, either by bonding, soldering, friction, or other mechanical linkage, top 38 is removed from about pins 34 of base 36 and the FET array 12 may be removed from base 36. At this stage, heat sink 14 may be bonded or attached to FET array 12 to form a power assembly 10. Alternatively, heat sink 14 could be pre-positioned within a device where a power supply is desired and power array 12 positioned atop heat sink 14.

While configurations of FET assemblies 16 are shown with two FET banks 26, more or fewer FET banks 26 may be included on each FET assembly 16. Similarly, four FET assemblies 16 are shown in FET array 12, and more or fewer FET arrays 12 may be used. The number of FETs 26 and/or the number of FET assemblies 16 included in each FET array 12 will typically be determined based on the power requirements of the device or devices that FET array 12 will be supplying.

Note that, except where otherwise stated, phrases such as, for example, "connected to" mean "connected directly to" or "connected indirectly to".

Also note that, except where otherwise stated, terms such as, for example, "comprises", "has", "includes", and all forms thereof, are considered open-ended, so as not to preclude additional elements and/or features.

While there have been shown and described various embodiments, it will be understood by those skilled in the art that the present invention is not limited to such embodiments, which have been presented by way of example only, and that various changes and modifications may be made without departing from the spirit and scope of the invention. Accordingly, the invention is limited only by the appended claims and equivalents thereto.

What is claimed is:

1. A power assembly comprising:
   a plurality of FET power assemblies, each FET power assembly including at least one field effect transistor having a power input and a power output mounted to a circuit board, the power assemblies positioned one atop the other;
   a power supply pin electrically connected to each of the power inputs of the field effect transistors, the power supply pin extending between the plurality of FET power assemblies through the circuit boards;
   a power output pin electrically connected to each of the power outputs of the FET power assemblies, the power output pin extending between the plurality of FET power assemblies through the circuit boards; and,
   a heat sink thermally coupled to FET power assemblies to dissipate heat generated by the field effect transistors, the heat sink mounted beneath a lower-most FET power assembly.

2. The power assembly of claim 1, wherein each FET power assembly includes two field effect transistors mounted to the circuit board.

3. The power assembly of claim 2, wherein two power supply pins extend through the circuit boards of the FET power assemblies, each power supply pin connected to one of the field effect transistors of each FET power assembly.

4. The power assembly of claim 2, wherein the two field effect transistors of each FET power assembly are electrically connected to the power output pin.

5. The power assembly of claim 1, wherein at least one structural pin extends between the FET power assemblies and the heat sink, the structural pin thermally connecting the heat sink and the FET power assemblies.

6. The power assembly of claim 2, wherein at least one structural pin for each field effect transistor of each assembly extends between the FET power assemblies and the heat sink, each structural pin thermally connecting the heat sink and the FET power assemblies.

7. The power assembly of claim 6, wherein four structural pins extend between the heat sink and each of the FET power assemblies.

8. The power assembly of claim 1, further comprising four FET power assemblies.

* * * * *

UNITED STATES PATENT AND TRADEMARK OFFICE
CERTIFICATE OF CORRECTION

| | | |
|---|---|---|
| PATENT NO. | : 7,193,307 B2 | Page 1 of 1 |
| APPLICATION NO. | : 10/863153 | |
| DATED | : March 20, 2007 | |
| INVENTOR(S) | : Duggan et al. | |

It is certified that error appears in the above-identified patent and that said Letters Patent is hereby corrected as shown below:

Title page
Item [57] Abstract line 3, replace "ciruit" with --circuit--.

Column 1 line 67, replace "heatsink" with --heat sink--.

Signed and Sealed this

First Day of May, 2007

JON W. DUDAS
*Director of the United States Patent and Trademark Office*